US010163746B2

(12) United States Patent
Ryu et al.

(10) Patent No.: US 10,163,746 B2
(45) Date of Patent: Dec. 25, 2018

(54) SEMICONDUCTOR PACKAGE WITH IMPROVED SIGNAL STABILITY AND METHOD OF MANUFACTURING THE SAME

(71) Applicant: Samsung Electro-Mechanics Co., Ltd., Suwon-si (KR)

(72) Inventors: Jong In Ryu, Suwon-si (KR); Ki Joo Sim, Suwon-si (KR); Do Jae Yoo, Suwon-si (KR); Ki Ju Lee, Suwon-si (KR); Jin Su Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/003,473

(22) Filed: Jan. 21, 2016

(65) Prior Publication Data

US 2016/0315027 A1   Oct. 27, 2016

(30) Foreign Application Priority Data

Apr. 23, 2015 (KR) .................. 10-2015-0057227

(51) Int. Cl.
| | |
|---|---|
| *H01L 23/31* | (2006.01) |
| *H01L 23/29* | (2006.01) |
| *H01L 21/56* | (2006.01) |
| *H01L 21/768* | (2006.01) |
| *H01L 23/538* | (2006.01) |
| *H01L 21/268* | (2006.01) |
| *H01L 23/16* | (2006.01) |

(Continued)

(52) U.S. Cl.
CPC ........ *H01L 23/3121* (2013.01); *H01L 21/565* (2013.01); *H01L 23/16* (2013.01); *H01L 23/293* (2013.01); *H01L 23/5383* (2013.01); *H01L 21/4846* (2013.01); *H01L 23/5386* (2013.01); *H01L 23/562* (2013.01); *H01L 2224/16227* (2013.01); *H01L 2224/48227* (2013.01); *H01L 2224/73253* (2013.01); *H01L 2924/15311* (2013.01); *H01L 2924/18161* (2013.01); *H01L 2924/19041* (2013.01); *H01L 2924/19042* (2013.01); *H01L 2924/19043* (2013.01); *H01L 2924/19106* (2013.01)

(58) Field of Classification Search
CPC ............ H01L 23/3121; H01L 23/5386; H01L 21/268; H01L 21/565; H01L 21/76879; H01L 23/293; H01L 23/31; H01L 23/29; H01L 21/56; H01L 21/768; H01L 23/538
USPC ....... 257/686, 685, 723, 728, 773, 774, 737, 257/738, 778
See application file for complete search history.

(56) References Cited

U.S. PATENT DOCUMENTS

| | | | |
|---|---|---|---|
| 6,351,030 B2* | 2/2002 | Havens ................... | H01L 21/56 257/690 |
| 7,259,445 B2* | 8/2007 | Lau ....................... | H01L 21/561 257/675 |

(Continued)

*Primary Examiner* — Alexander Oscar Williams
(74) *Attorney, Agent, or Firm* — NSIP Law

(57) ABSTRACT

A semiconductor package and manufacturing method thereof includes a chip member installed on an upper surface, a lower surface, or both of a substrate. The semiconductor package and manufacturing method thereof also include a mold part stacked embedding the chip member, a connection member disposed at a center portion of the mold part, and a solder part formed on a portion of the connection member.

20 Claims, 6 Drawing Sheets

(51) Int. Cl.
*H01L 23/00* (2006.01)
*H01L 21/48* (2006.01)

(56) References Cited

U.S. PATENT DOCUMENTS

| | | | | |
|---|---|---|---|---|
| 8,779,601 B2* | 7/2014 | Gan | | H01L 23/48 |
| | | | | 257/686 |
| 9,035,472 B2* | 5/2015 | Nagasawa | | H01L 23/3677 |
| | | | | 257/690 |
| 9,299,630 B2* | 3/2016 | Gowda | | H01L 23/5389 |
| 9,748,179 B2* | 8/2017 | Yoo | | H01L 23/552 |
| 9,907,186 B1* | 2/2018 | Chiu | | H05K 3/323 |
| 9,935,083 B2* | 4/2018 | Lee | | H01L 25/0657 |
| 2002/0121705 A1* | 9/2002 | Pu | | H01L 23/3128 |
| | | | | 257/778 |
| 2007/0170578 A1* | 7/2007 | Yoshikawa | | H01L 21/4846 |
| | | | | 257/700 |
| 2008/0122061 A1* | 5/2008 | Edwards | | H01L 23/3677 |
| | | | | 257/690 |
| 2008/0220563 A1 | 9/2008 | Karnezos | | |
| 2010/0027225 A1 | 2/2010 | Yuda et al. | | |
| 2010/0258946 A1* | 10/2010 | Uchiyama | | H01L 21/486 |
| | | | | 257/774 |
| 2014/0138836 A1* | 5/2014 | Nagasawa | | H01L 23/3677 |
| | | | | 257/766 |
| 2014/0374902 A1* | 12/2014 | Lee | | H01L 23/36 |
| | | | | 257/738 |
| 2015/0091149 A1* | 4/2015 | Jang | | H01L 23/3128 |
| | | | | 257/686 |
| 2015/0091152 A1* | 4/2015 | Jo | | H05K 1/09 |
| | | | | 257/693 |
| 2015/0131231 A1* | 5/2015 | Yoo | | H05K 3/284 |
| | | | | 361/707 |
| 2015/0131235 A1* | 5/2015 | Yoo | | H05K 5/065 |
| | | | | 361/728 |
| 2015/0137339 A1* | 5/2015 | Oh | | H01L 23/3121 |
| | | | | 257/690 |
| 2015/0181708 A1* | 6/2015 | Ryu | | H05K 1/111 |
| | | | | 361/728 |
| 2015/0223361 A1* | 8/2015 | Lim | | H05K 3/3478 |
| | | | | 361/728 |
| 2015/0289392 A1* | 10/2015 | Yoo | | H05K 1/181 |
| | | | | 361/736 |
| 2016/0007463 A1* | 1/2016 | Yoo | | H05K 3/284 |
| | | | | 361/767 |
| 2017/0005032 A1* | 1/2017 | Kim | | H01L 25/0657 |
| 2017/0018540 A1* | 1/2017 | Lim | | H01L 25/16 |
| 2017/0033039 A1* | 2/2017 | Lee | | H01L 23/49861 |
| 2017/0064825 A1* | 3/2017 | Ishihara | | H05K 1/113 |
| 2017/0069558 A1* | 3/2017 | Bang | | H01L 23/3128 |
| 2017/0141084 A1* | 5/2017 | Vincent | | H01L 21/78 |

* cited by examiner

SEMICONDUCTOR PACKAGE WITH IMPROVED SIGNAL STABILITY AND METHOD OF MANUFACTURING THE SAME

CROSS-REFERENCE TO RELATED APPLICATION

This application claims the priority and benefit under 35 USC 119(a) of Korean Patent Application No. 10-2015-0057227 filed on Apr. 23, 2015, with the Korean Intellectual Property Office, the disclosure of which is incorporated herein by reference.

BACKGROUND

1. Field

The following description relates to a semiconductor package and a method of manufacturing the same.

2. Description of Related Art

In order to manufacture compact, high-performance semiconductor packages, a recent trend exists to develop a structure in which electronic components are mounted on upper and lower surfaces of a substrate.

However, in the case of mounting electronic components on the upper and lower surfaces of the substrate, mold parts are formed on the upper and lower surfaces of the substrate. As a result, it is difficult to form an external connection terminal.

Furthermore, the external connection terminal is mainly disposed at an outer region of the lower surface of the mold part. Also, as a module size increases, the substrate is vulnerable to stress due to a structure in which pins are only disposed at an outer region.

Further, a signal characteristic received and processed by the electrical components in the substrate is degraded because it is difficult to insert a copper pattern on a mold part in such a structure due to reduced adhesiveness between a mold part and plating.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a semiconductor package, including: a chip member installed on an upper surface, a lower surface, or both of a substrate; a mold part stacked embedding the chip member; a connection member disposed at a center portion of the mold part; and a solder part formed on a portion of the connection member.

The connection member may be partially exposed to an exterior of the mold part.

The solder part may be positioned to be exposed to an exterior of the connection member.

The mold part may include a first mold part stacked on the upper surface of the substrate, and a second mold part stacked on the lower surface of the substrate.

The connection member may be stacked on the second mold part, and has a plate shape.

The connection member may be connected to the substrate by an auxiliary connection conductor.

Main connection conductors may be formed at an edge of the second mold part.

The connection member may be formed by electroless plating or patterning using a conductive paste.

The mold part may be formed of an EMC (epoxy molding compound).

The chip member may be partially exposed to an exterior of the first mold part.

The chip member may be partially exposed to an exterior of the second mold part.

The solder part may be formed at a center portion of the second mold part.

In accordance with another embodiment, there is provided a method of manufacturing a semiconductor package, including: mounting at least one chip member on a substrate; forming a mold part sealing the chip member; stacking a connection member on the mold part; restacking the mold part on the connection member; and forming a solder part on a portion of the connection member.

The method may further include: partially exposing the connection member to an exterior of the mold part.

The method may further include: positioning the solder part on the connection member to be exposed to an exterior of the connection member.

The stacking of the connection member on the mold part may include: partially etching the mold part; and forming the connection member on a groove formed by the etching.

The connection member may be formed by electroless plating or patterning using a metal paste.

The restacking of the mold part on the connection member may include: stacking the mold part to embed the connection member; and forming an exposure hole by laser drilling to partially expose the connection member.

Other features and aspects will be apparent from the following detailed description, the drawings, and the claims.

BRIEF DESCRIPTION OF DRAWINGS

These and/or other aspects will become apparent and more readily appreciated from the following description of the embodiments, taken in conjunction with the accompanying drawings in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
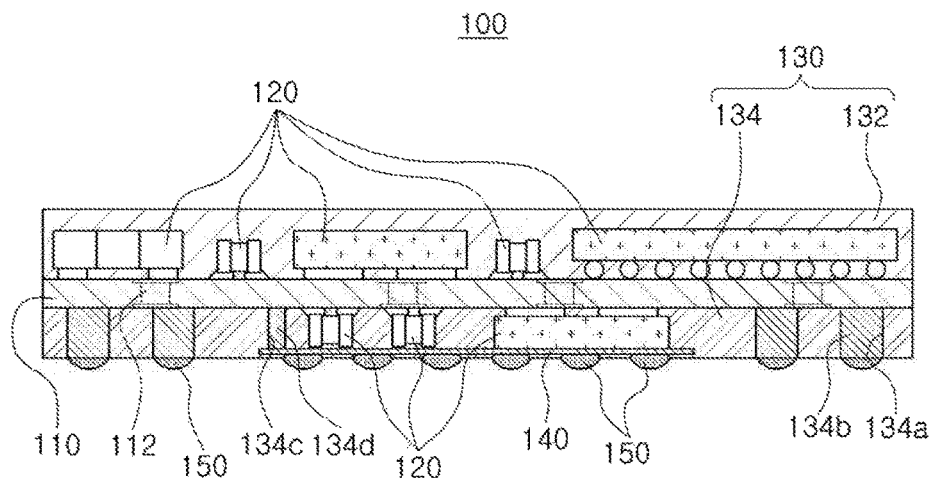
FIG. 1 is a schematic cross-sectional view illustrating a semiconductor package, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Figure 2:
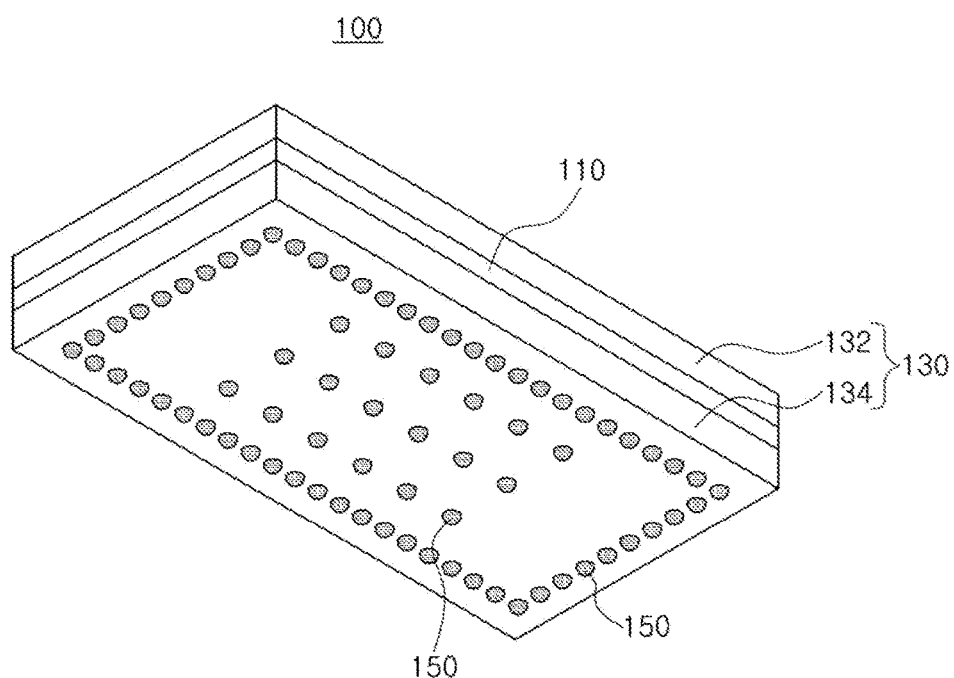
FIG. 2 is a bottom perspective view illustrating the semiconductor package, according to an embodiment.

FIG. 1 is a schematic cross-sectional view illustrating a semiconductor package, according to an embodiment. FIG. 2 is a bottom perspective view illustrating the semiconductor package, according to an embodiment.

Referring to FIGS. 1 and 2, the semiconductor package 100, according to an embodiment, includes a substrate 110, chip members 120, mold parts 130, a connection member 140, and solder parts 150.

The substrate 110 is an element to mount chip members 120 on at least one surface thereof, and is any one of various kinds of substrates such as a ceramic substrate, a printed circuit substrate, and a flexible substrate.

Further, on one or both of upper and lower surfaces of the substrate 110, a mounting electrode (not shown) to mount a chip member 120, or a wiring pattern (not shown) to electrically connect the mounting electrodes to each other, may be formed.

In addition, the substrate 110 is a multilayer substrate including a plurality of layers, and circuit patterns (not shown) to form electrical connection may be formed between each of the plurality of layers.

In addition, a conductive via 112 electrically connects the mounting electrodes formed on the upper and lower surfaces of the substrate 110, and the circuit patterns formed in the substrate 110.

Chip members 120 are mounted on at least one surface of the substrate 110, and include various elements, such as a passive element and an active element. The passive element may include at least one of a resistor, an inductor, or a capacitor. The active element may be any electronic element that provides a power gain or supplying any energy or controlling a current flow within the substrate 110. Any element may be used as the chip member 120, if the element may be mounted on the substrate 110.

These chip members 120 are mounted on both of the upper and lower surfaces of the substrate 110.

In addition, the chip members 120 are disposed on the upper and lower surfaces of the substrate 110 in various forms, depending on a size and a shape of the chip member 120, and a design of the semiconductor package 100.

Further, the chip members 120 are mounted on the substrate 110 in the form of flip chips, or are electrically bonded to the substrate 110 through a bonding wire.

The mold parts 130 are stacked on the substrate 110 so that the chip members 120 are embedded therein. Also, the mold parts 130 include a first mold part 132 stacked on the upper surface of the substrate 110 and a second mold part 134 stacked on the lower surface of the substrate 110.

That is, the mold parts 130 seal the chip members 120 mounted on the upper and lower surfaces of the substrate 110. Further, a gap between the chip members 120 mounted on the substrate 110 is filled to prevent an occurrence of electrical short circuits between the chip members 120, and the mold parts 130 surround an exterior of the chip members 120 to fix the chip members 120 on the substrate 110. Accordingly, breakage and separation of the chip members 120 from external impact is prevented.

The mold parts 130 are formed of insulation materials including resin materials, for example, an epoxy such as EMC (epoxy molding compound).

In an embodiment the first mold part 132 is stacked on the upper surface of the substrate 110 so that the chip members 120 are all embedded in the first mold part 132. However, the stacking manner is not limited thereto, and various alternative embodiments are possible. For example, at least one of the chip members 120 may be partially exposed to the exterior of the first mold part 132.

Further, the second mold part 134 is stacked on the lower surface of the substrate 110 so that the chip members 120 are all embedded in the second mold part 134. However, as with the first mold part 132, in the case of the second mold part 134, various alternative embodiments are possible. For example, at least one of the chip members 120 may be partially exposed to the exterior of the second mold part 134.

Further, at least one via hole 134a is provided at the edge of the second mold part 134, and a main connection conductor 134b is disposed within the via hole 134a.

In addition, the portion of the second mold part 134 that embeds the connection member 140 is formed of insulation materials different from other portions. However, the insulation materials are not limited thereto, and the portion for embedding the connection member 140 may be formed of insulation materials identical to other portions. Some of the insulation materials may be silicon, polycrystalline diamond, aluminum nitride, beryllium oxide, and other similar insulation materials.

In addition, at least one auxiliary via hole 134c is provided at the center portion of the second mold part 134, and an auxiliary connection conductor 134d is disposed within the auxiliary via hole 134c. The auxiliary connection conductor 134d is an element to electrically connect the connection member 140 and the substrate 110, and accordingly, a solder part 150 is formed on the connection member 140.

Further, one end of the main connection conductor 134b is connected to the lower surface of the substrate 110, and the other end is exposed to the exterior of the second mold part 134. That is, the main connection conductor 134b is disposed to penetrate the second mold part 134.

Further, the main connection conductor 134b is formed of conductive materials, such as gold, silver, aluminum, or an alloy thereof. The auxiliary connection conductor 134d may also be formed of the conductive materials.

The connection member 140 is disposed at a center portion of the mold part 130, but stacked to be partially exposed to the exterior of the second mold part 134. That is, the connection member 140 is stacked at the center portion of the second mold part 134, and has a plate shape. As an example, the connection member 140 has a tetragonal plate shape. In an alternative embodiment, the connection member 140 is disposed slightly off-center from the center portion of the mold part 130.

Furthermore, the connection member 140 is formed through electroless plating, or also through patterning using a conductive paste.

Further, solder parts 150 are formed on the portions of the connection member 140 and are positioned to be exposed to the exterior of the connection member 140. As such, the solder parts 150 are connected to the connection member 140, and thus, signal stability is improved through the connection part (IO pin) increase of a power source/ground end, and the solder part 150 is disposed at the center portion of the semiconductor package 100 to relieve concentration of stress.

Further, the auxiliary connection conductor 134d electrically connects the connection member 140 to the substrate 110.

Furthermore, the connection member 140 easily blocks noise introduced from a main substrate (not shown), and conversely, prevents noise produced in the semiconductor package 100 from being introduced to the main substrate.

The solder part 150 is stacked on the connection member 140 exposed to the exterior. Furthermore, the solder part 150 is also stacked on the above-described main connection conductor 134b. As such, the solder part 150 is formed at an edge and center portions of the second mold part 134, thereby relieving concentration of stress.

That is, compared to conventional semiconductor packages in which the solder part is only stacked on the main connection conductor, the solder part 150, in accordance with an embodiment, is also formed at the center portion of the second mold part 134, thereby relieving concentration of stress at the edge portions of the semiconductor package 100.

Furthermore, the solder part 150 is also formed at the center portion, thereby improving signal stability through a connection part (IO pin) increase.

As described above, the solder parts 150 are formed at the center portion of the semiconductor package 100 through the connection member 140 stacked to be embedded in the center portion of the second mold part 134.

Accordingly, signal stability is improved, and furthermore, concentration of stress may be relieved.

Hereinafter, a method of manufacturing a semiconductor package, according to an embodiment, will be described with reference to the accompanying drawings.

FIGS. 3 through 9 are process flow diagrams illustrating a method of manufacturing a semiconductor package, according to an embodiment.

Hereinafter, referring to FIG. 3 through FIG. 9 in order, a method of manufacturing a semiconductor package, according to an embodiment, will be described.

Figure 3:
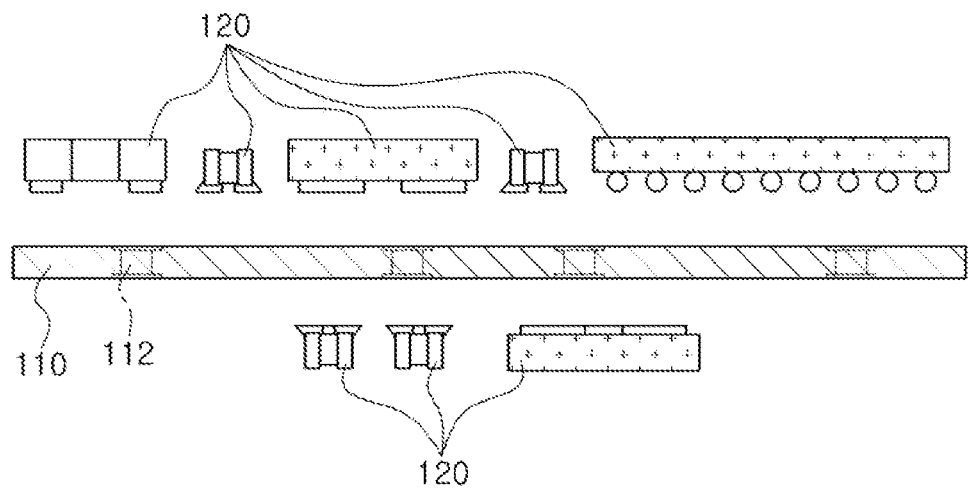
FIGS. 3 and 4 are process flow diagrams illustrating a mounting of a substrate and a chip member in the semiconductor package, according to an embodiment.
Figure 4:
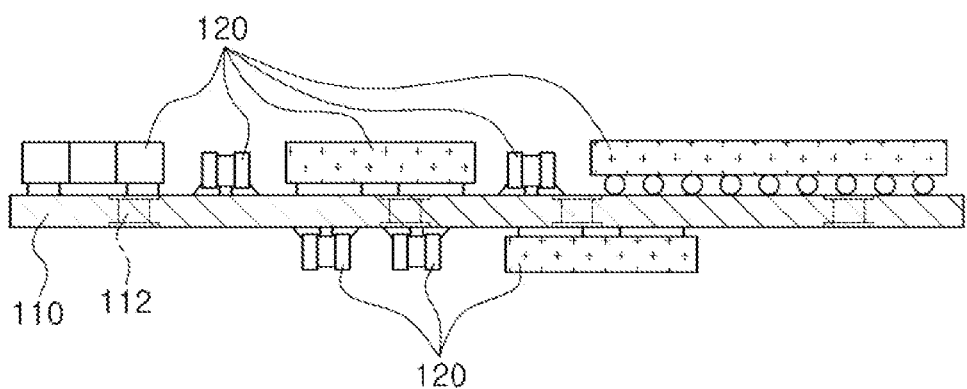

FIGS. 3 and 4 are process flow diagrams illustrating a mounting of a substrate and chip members of a semiconductor package, according to an embodiment.

Referring to FIG. 3, first, a substrate 110 is prepared. The substrate 110 is an element to mount chip members 120 on the upper and lower surfaces thereof, and may be any one of various kinds of substrates, such as a ceramic substrate, a printed circuit substrate, and a flexible substrate.

Further, on one or both of the upper and lower surfaces of the substrate 110, a mounting electrode (not shown) to mount a chip member 120, or a wiring pattern (not shown) electrically connecting the mounting electrodes to each other is formed.

In an embodiment, the substrate 110 is a multilayer substrate including a plurality of layers, and circuit patterns (not shown) to form an electrical connection between each of the plurality of layers.

In addition, the substrate 110 includes a conductive via 112 electrically connecting the mounting electrodes formed on the upper and lower surfaces of the substrate 110, and the circuit patterns formed on the substrate 110.

Also, at least one chip member 120 is mounted on the substrate 110. That is, the chip members 120 are mounted on the upper and lower surfaces of the substrate 110, as illustrated in FIG. 4. In an example, the chip members 120 are mounted on the substrate 110 in the form of flip chips, or electrically bonded to the substrate 110 through a bonding wire.

Also, the chip members 120 include various elements such as a passive element and an active element. A passive or active element may be used as the chip member 120, when the element is mounted on the substrate 110.

In addition, the chip members 120 are disposed on the upper and lower surfaces of the substrate 110 in various shapes and sizes, depending on the size and form of the chip members 120, and the design of the semiconductor package 100.

Figure 5:
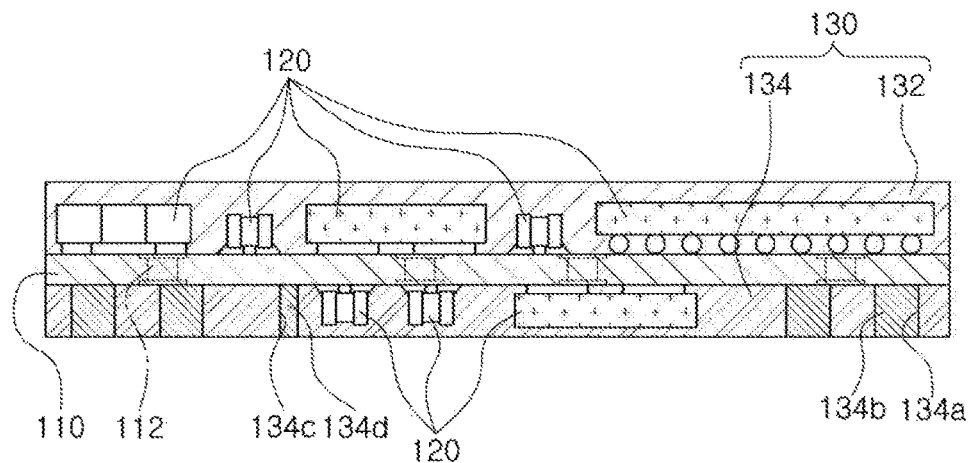
FIG. 5 is a process flow diagram illustrating a formation of a mold part of the semiconductor package, according to an embodiment.

FIG. 5 is a process flow diagram illustrating a formation of a mold part of the semiconductor package, according to an embodiment.

Referring to FIG. 5, the mold parts 130 are stacked on the substrate 110 so that the chip members 120 are sealed. That is, the mold parts 130 include a first mold part 132 embedding the chip members 120 mounted on the upper surface of the substrate 110 and a second mold part 134 embedding the chip members 120 mounted on the lower surface of the substrate 110.

As such, a gap between the chip members 120 mounted on the substrate 110 is filled with the first and second mold parts 132 and 134 to prevent an occurrence of electrical short circuits between the chip members 120. The mold parts 132 and 134 surround an exterior of the chip members 120 to serve to fix the chip members 120 on the substrate 110. Accordingly, breakage and separation of the chip members 120 from external impact is prevented.

These mold parts 130 are formed of insulation materials including resin materials, for example, an epoxy such as EMC (epoxy molding compound).

Meanwhile, in an embodiment, the first and second mold parts 132 and 134 are stacked on the upper and lower surfaces of the substrate 110 so that the chip members 120 are all embedded in the first and second mold parts 132 and 134. However, the stacking manner is not limited thereto, and various alternative embodiments may be possible. For example, at least one of the chip members 120 may be partially exposed to the exterior of the first and second mold parts 132 and 134.

Further, in one example, a via hole 134a is formed at the edge of the second mold part 134, and an auxiliary via hole 134c is formed at the center portion of the second mold part 134. A main connection conductor 134b and an auxiliary connection conductor 134d are formed in the via hole 134a and the auxiliary via hole 134c.

The main connection conductor 134b and the auxiliary connection conductor 134d are formed of conductive materials, such as gold, silver, aluminum, or alloys thereof.

Figure 6:
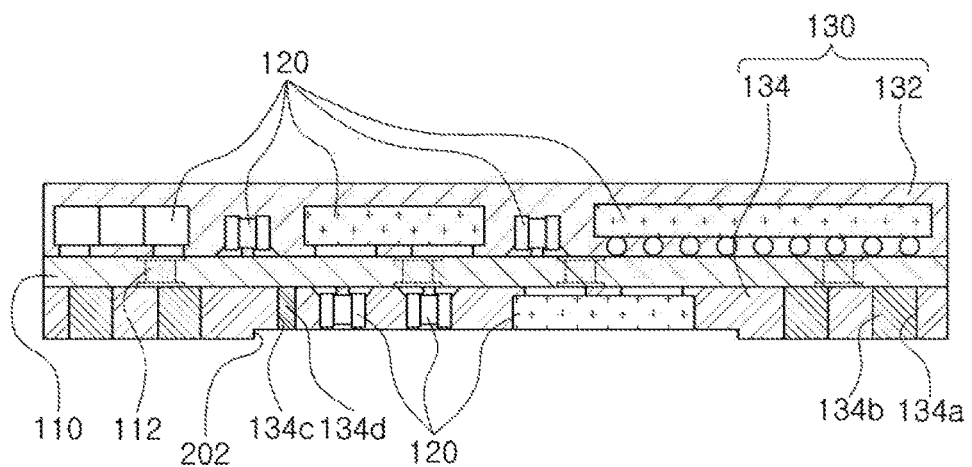
FIG. 6 is a process flow diagram illustrating etching of a mold part of the semiconductor package, according to an embodiment.
Figure 7:
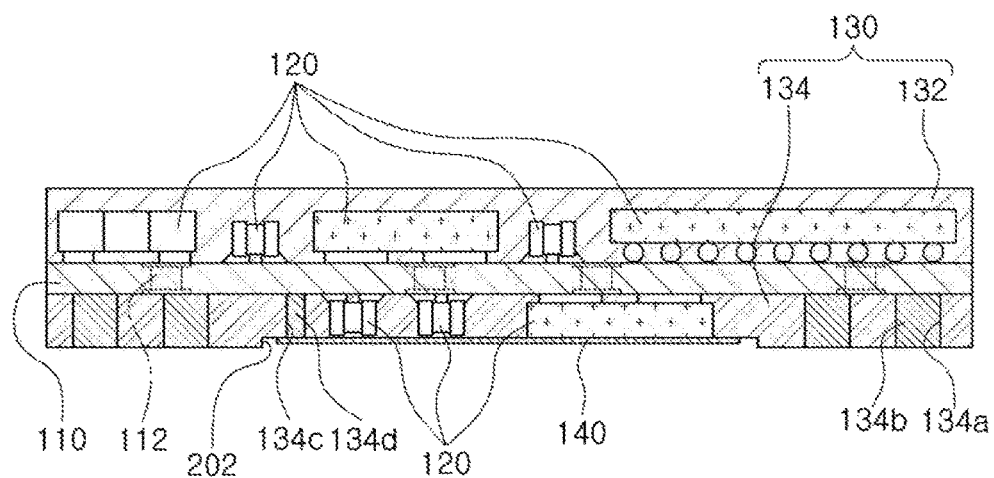
FIG. 7 is a process flow diagram illustrating a formation of a connection member of the semiconductor package, according to an embodiment.

FIG. 6 is a process flow diagram illustrating etching of the mold part of the semiconductor package, according to an embodiment. FIG. 7 is a process flow diagram illustrating a formation of the connection members of the semiconductor package, according to an embodiment.

Referring to FIG. 6, a second mold part 134 stacked on the substrate 110 is etched. That is, a groove 202 is formed by the etching of the second mold part 134. In one illustrative example, the groove 202 formed on the second mold part 134 is larger than a size of the connection member 140.

In an example, when the second mold part 134 is restacked on the connection member 140 after forming the connection member 140 on the second mold part 134, the groove 202 is formed to be larger than the size of the connection member 140 to increase bonding strength between the restacked second mold part 134 and the existing second mold part 134. In an alternative example, the groove 202 is of a same size as the connection member 140.

Further, the above-described auxiliary connection conductor 134d is exposed to the exterior on the groove 202 formed by the second mold part 134. That is, the auxiliary connection conductor 134d is etched.

Further, the groove 202 formed by etching is disposed at the center portion of the second mold part 134. Further, the groove 202 has a depth to easily expose the connection member 140. In an alternative configuration, the groove 202 is disposed at a slight off-center portion of the second mold part 134.

Furthermore, as illustrated in FIG. 7, the connection member 140 is stacked on the groove 202 formed by the etching of the second mold part 134. In an example, the connection member 140 is formed through electroless plating, or through patterning using a conductive paste.

Further, the connection member 140 is formed to be in contact with the auxiliary connection conductor 134d.

In addition, the connection member 140 is formed to have a size smaller than the size of the groove 202 formed on the second mold part 134, as described above. That is, the connection member 140 is formed by being stacked so that the connection member 140 has an area smaller than the area of the groove 202 formed on the second mold part 134.

Meanwhile, the connection member 140 has a tetragonal plate shape.

Figure 8:
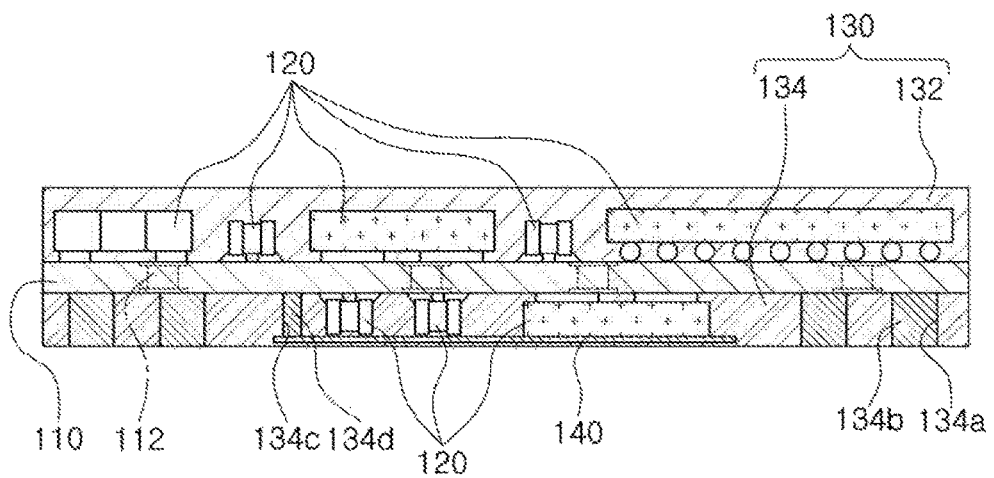
FIG. 8 is a process flow diagram illustrating a second mold part being restacked to embed a connection member of the semiconductor package according to an embodiment.
Figure 9:
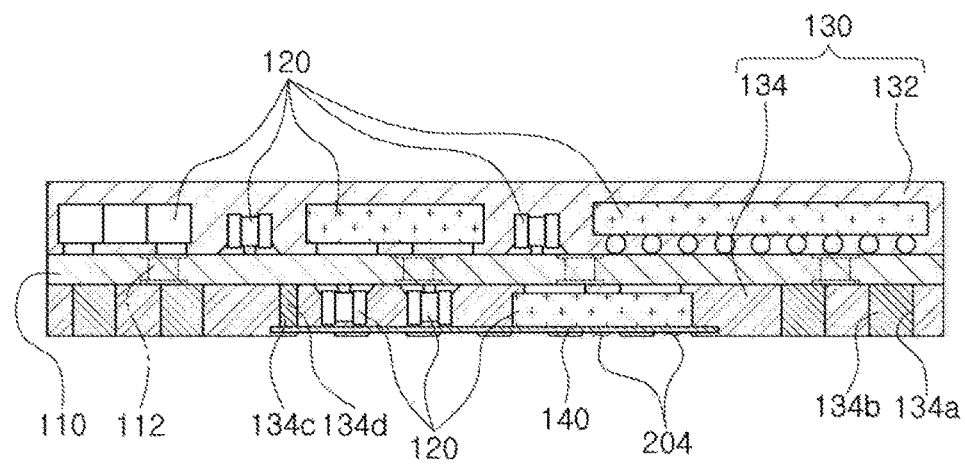
FIG. 9 is a process flow diagram for describing a partial exposure of a connection member of the semiconductor package, according to an embodiment.

FIG. 8 is a process flow diagram illustrating the second mold part being restacked to embed the connection member of the semiconductor package, according to an embodiment. FIG. 9 is a process flow diagram illustrating a partial exposure of the connection member of the semiconductor package, according to an embodiment.

Referring to FIG. 8, the second mold part 134 is restacked on the groove 202 (see FIG. 7) formed by the etching of the second mold part 134. Also, the restacked second mold part 134 is formed of the insulation materials identical to or different from those of other portions.

Further, because the groove 202 formed by the etching of the second mold part 134 is formed to have a size larger than the connection member 140, bonding strength between the second mold part 134 restacked on the groove 202 and the second mold part 134 previously stacked may increase.

Accordingly, the connection member 140 is firmly embedded in the second mold part 134, thus, preventing lifting or deformation of the connection member 140.

Thereafter, as illustrated in FIG. 9, an exposure hole 204 is formed on the second mold part 134 restacked to embed the connection member 140. In an example, the second mold part 134 is stacked on the connection member 140, thus, partially exposing the connection member 140 to the exterior.

In an example, the exposure hole 204 is formed by laser drilling.

As such, the connection member 140 is partially exposed to the exterior by forming the exposure hole 204.

Figure 10:
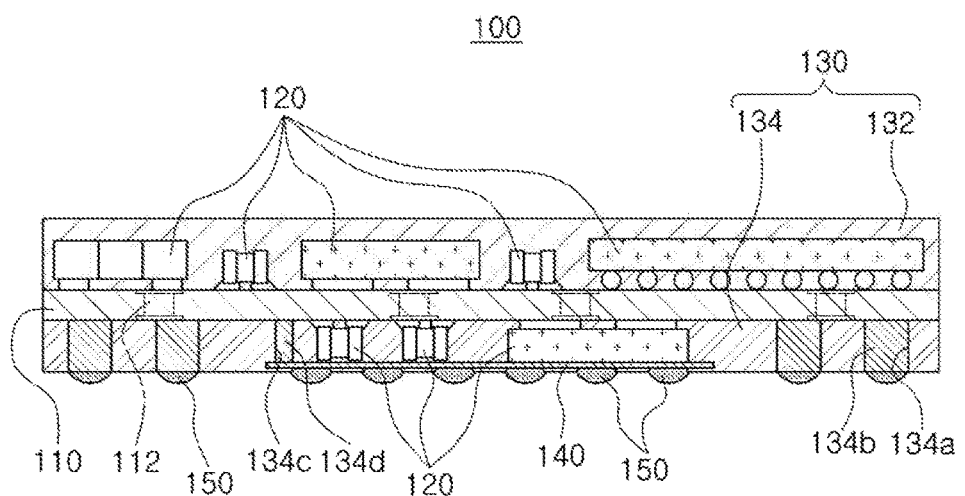
FIG. 10 is a process flow diagram illustrating a formation of a solder part of the semiconductor package, according to an embodiment.

FIG. 10 is a process flow diagram to describe a formation of a solder part of a semiconductor package, according to an embodiment.

Referring to FIG. 10, the solder part 150 is stacked on the connection member 140 exposed to the exterior. Furthermore, the solder part 150 is also stacked on the main connection conductor 134b. As such, the solder part 150 is formed at the edge and center portion of the second mold part 134.

The solder part 150 is formed at the edge and at the center portion of the second mold part 134 to relieve concentration of stress.

That is, as compared with the case in which the solder part 150 is only stacked on the main connection conductor 134b, the solder part 150 is also formed at the center portion of a second mold part 134 to relieve concentration of stress at the edge portion of the semiconductor package 110.

Furthermore, the solder part 150 is also formed at the center portion to improve signal stability through a connection part (IO pin) increase.

Also, as described above, the connection member 140 has a size smaller than the groove 202 of the second mold part 134 formed by the etching, to increase bonding strength between the restacked second mold part 134 and the previously formed second mold part 134 when restacking the second mold part.

Accordingly, the connection member 140 is firmly bonded to the second mold part 134 to prevent lifting and deformation of the connection member 140.

Furthermore, concentration of stress applied to the edge of the semiconductor package 100 is prevented through the solder part 150 formed on the connection member 140.

In addition, noise is easily blocked through the connection member 140.

Further, the solder part 150 is formed at the center portion to improve signal stability through a connection part (IO pin) increase.

Figure 11:
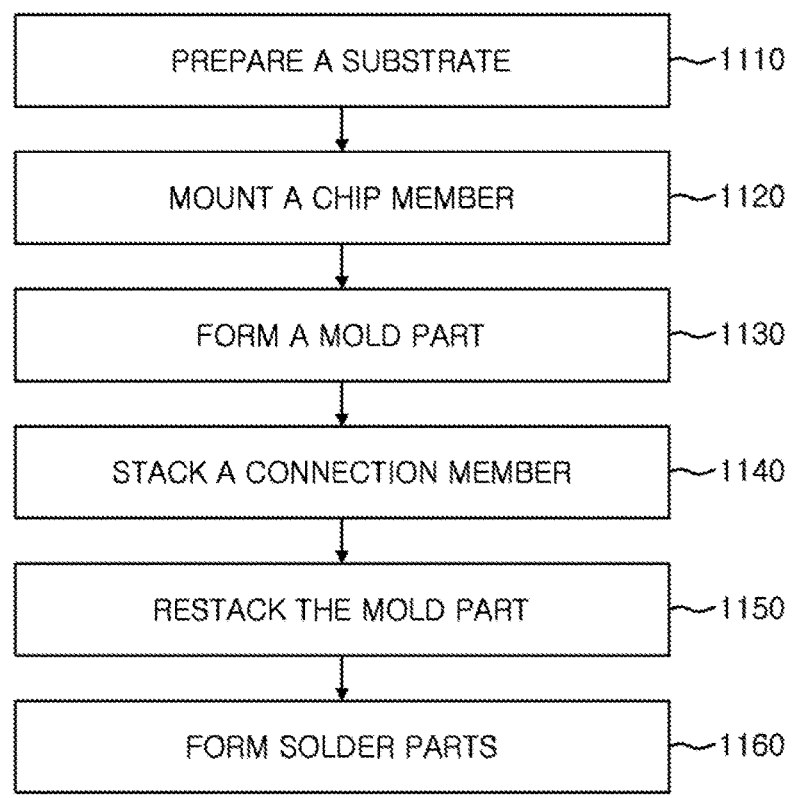
FIG. 11 illustrates a method of manufacturing a semiconductor package in accordance with an embodiment.

FIG. 11 illustrates a method of manufacturing the semiconductor package 100, in accordance with an embodiment. The functions illustrated in FIG. 11 and described below were previously discussed in detail while describing the structural elements illustrated in FIGS. 3 through 10, as the semiconductor package 100 is formed. Thus, the descriptions previously included are incorporated herein. At operation 1110, the method prepares the substrate 110. At operation 1120, the method mounts at least one chip member 120 on the substrate 110. At operation 1130, the method forms a mold part 130 sealing the chip member 120. At operation 1140, the method stacks a connection member 140 on the mold part 130. At operation 1150, the method restacks the mold part 130 on the connection member 140 so that the connection member 140 is partially exposed. At operation 1160, the method forms solder parts 150 on the connection member 140 exposed to an exterior thereof.

As set forth above, according to various embodiments, signal stability is improved, and concentration of stress is prevented.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
a chip member disposed on a surface of a substrate;
a mold part stacked on the surface of the substrate and embedding the chip member;
a connection member disposed on at least a portion of the mold part at a center portion thereof;
an auxiliary connection conductor connecting the connection member to the substrate;
a main connection conductor spaced apart from the connection member and penetrating the molding part; and
a solder part comprising a first solder part disposed on the connection member and a second solder part disposed on the main connection conductor, the solder part being extended from the mold part.

2. The semiconductor package of claim 1, wherein the connection member is partially exposed to an exterior of the mold part.

3. The semiconductor package of claim 1, wherein the solder part is positioned to be exposed to an exterior of the connection member.

4. The semiconductor package of claim 1, wherein the mold part comprises a first mold part stacked on an upper surface of the substrate, and a second mold part stacked on a lower surface of the substrate.

5. The semiconductor package of claim 4, wherein the connection member is stacked on the second mold part, and the connection member comprises a plate shape.

6. The semiconductor package of claim 4, wherein the main connection conductors are formed at an edge of the second mold part.

7. The semiconductor package of claim 1, wherein the connection member comprises electroless plating or a conductive paste.

8. The semiconductor package of claim 1, wherein the mold part comprises an EMC (epoxy molding compound).

9. The semiconductor package of claim 4, wherein the chip member is partially exposed to at least one of an exterior of the first mold part and an exterior of the second mold part.

10. The semiconductor package of claim 1, wherein at least a portion of the mold part is stacked on the connection member.

11. The semiconductor package of claim 4, wherein the solder part is formed at a center portion of the second mold part.

12. A method of manufacturing a semiconductor package, comprising:
mounting at least one chip member on a substrate;
forming a mold part sealing the at least one chip member;
stacking a connection member directly on the mold part;
restacking the mold part on the connection member;
forming an auxiliary connection conductor connecting the connection member to the substrate;
forming a main connection conductor spaced apart from the connection member and penetrating the molding part; and
forming a solder part comprising a first solder part on the connection member and a second solder part on the main connection conductor, the solder part being extended from the mold part.

13. The method of claim 12, further comprising:
partially exposing the connection member to an exterior of the mold part.

14. The method of claim 12, further comprising:
positioning the solder part on the connection member to be exposed to an exterior of the connection member.

15. The method of claim 12, wherein the stacking of the connection member on the mold part comprises:
partially etching the mold part; and
forming the connection member on a groove formed by the etching.

16. The method of claim 15, wherein the connection member is formed by electroless plating or patterning using a metal paste.

17. The method of claim 12, wherein the restacking of the mold part on the connection member comprises:
stacking the mold part to embed the connection member; and
forming an exposure hole by laser drilling to partially expose the connection member.

18. The semiconductor package of claim 1, wherein a portion of the mold part embeds the connection member, and comprises a different material from another portion of the mold part.

19. The semiconductor package of claim 1, wherein the solder part is exposed to an exterior of the mold part and evenly distributed along a length direction of the mold part to relieve a concentration of stress.

20. A semiconductor package, comprising:
a substrate;
chip members disposed on upper and lower surfaces of the substrate;
mold parts stacked so that the chip members are embedded; and
a connection member disposed in a center portion of each mold part, stacked to be partially exposed to an exterior of the respective mold part;
wherein each mold part comprises an auxiliary connection conductor for connecting the connection member to the substrate and a main connection conductor formed to penetrate the mold part, and a solder part disposed on the connection member and the main connecting conductor.

\* \* \* \* \*